US012013439B2

(12) United States Patent
Kurisawa et al.

(10) Patent No.: US 12,013,439 B2
(45) Date of Patent: Jun. 18, 2024

(54) DATA PROCESSOR, DATA PROCESSING METHOD, AND COMPUTER PROGRAM

(71) Applicant: GS Yuasa International Ltd., Kyoto (JP)

(72) Inventors: Isamu Kurisawa, Kyoto (JP); Tomikatsu Uchihori, Kyoto (JP); Kayo Yamasaki, Kyoto (JP); Hitoshi Matsushima, Kyoto (JP)

(73) Assignee: GS YUASA INTERNATIONAL LTD., Kyoto (JP)

( * ) Notice: Subject to any disclaimer, the term of this patent is extended or adjusted under 35 U.S.C. 154(b) by 286 days.

(21) Appl. No.: 17/418,520

(22) PCT Filed: Dec. 20, 2019

(86) PCT No.: PCT/JP2019/049972

§ 371 (c)(1),
(2) Date: Jun. 25, 2021

(87) PCT Pub. No.: WO2020/137838

PCT Pub. Date: Jul. 2, 2020

(65) Prior Publication Data

US 2022/0082625 A1 Mar. 17, 2022

(30) Foreign Application Priority Data

Dec. 28, 2018 (JP) ................................ 2018-248109

(51) Int. Cl.
*G01R 31/367* (2019.01)
*G06N 20/00* (2019.01)
*H01M 10/48* (2006.01)

(52) U.S. Cl.
CPC .......... *G01R 31/367* (2019.01); *G06N 20/00* (2019.01); *H01M 10/48* (2013.01)

(58) Field of Classification Search
CPC ...... G01R 31/367; G06N 20/00; H01M 10/48
See application file for complete search history.

(56) References Cited

U.S. PATENT DOCUMENTS 6,418,425 B1 * 7/2002 Maeda .................... G06N 5/00 706/47
8,855,954 B1 * 10/2014 Bickford ............. G01R 31/392 702/63

(Continued)

FOREIGN PATENT DOCUMENTS

JP 2003-249271 A 9/2003
JP 2003249271 A * 9/2003 .......... G01R 31/392

(Continued)

OTHER PUBLICATIONS

Aggarwal, Neural Neteworks and Deep Learning, Springer International Publishing AG, Part of Springer Nature 2018, Aug. 25, 2018, 497 Pages (Year: 2018).*

(Continued)

*Primary Examiner* — Raymond L Nimox
(74) *Attorney, Agent, or Firm* — Alston & Bird LLP

(57) ABSTRACT

A data processing device that processes measurement data for power storage elements, said device comprising: a storage unit that stores a determination model trained so as to output a score corresponding to whether, upon the input of measurement data measured for each of the power storage elements or for each power storage element group formed by grouping a plurality of the power storage elements, measurement data from a non-conforming power storage element is included in said measurement data; and an identification unit that inputs acquired measurement data into the determination model, and identifies measurement data from a non-conforming power storage element on the basis of the outputted score.

11 Claims, 14 Drawing Sheets

101 C L
Mega solar power generating system S
Thermal power generating system F
Wind power generating system W
100 P N N1 N2 AP BS 2 3 33 34 33, 34

(56) References Cited

U.S. PATENT DOCUMENTS

| | | | | |
|---|---|---|---|---|
| 10,852,357 | B2 * | 12/2020 | Geffin | G01R 31/367 |
| 2006/0284617 | A1 * | 12/2006 | Kozlowski | H01M 10/48 324/426 |
| 2008/0148220 | A1 * | 6/2008 | Tabaru | G06Q 10/06 717/103 |
| 2008/0234956 | A1 | 9/2008 | Mizuno et al. | |
| 2012/0175953 | A1 * | 7/2012 | Ohkawa | B60L 58/13 307/18 |
| 2012/0290879 | A1 * | 11/2012 | Shibuya | G05B 23/021 714/26 |
| 2013/0253898 | A1 * | 9/2013 | Meagher | G06N 20/00 703/18 |
| 2013/0262013 | A1 * | 10/2013 | Ide | G06F 17/18 702/108 |
| 2014/0136178 | A1 * | 5/2014 | Meagher | G06N 20/00 703/18 |
| 2016/0195587 | A1 * | 7/2016 | Lee | G01R 31/392 702/63 |
| 2016/0231386 | A1 * | 8/2016 | Sung | G01R 31/382 |
| 2016/0356856 | A1 * | 12/2016 | Hongo | G01R 31/392 |
| 2016/0363632 | A1 | 12/2016 | Park et al. | |
| 2017/0097863 | A1 * | 4/2017 | Ishii | G06F 16/285 |
| 2017/0097980 | A1 * | 4/2017 | Ishii | G06N 20/00 |
| 2018/0123357 | A1 * | 5/2018 | Beaston | H02J 3/381 |
| 2018/0143257 | A1 * | 5/2018 | Garcia | G01R 31/382 |
| 2018/0316707 | A1 * | 11/2018 | Dodson | H04L 43/16 |
| 2018/0330250 | A1 * | 11/2018 | Nakayama | G06Q 10/0635 |
| 2019/0033395 | A1 * | 1/2019 | Karner | G06Q 10/06315 |
| 2019/0086478 | A1 * | 3/2019 | Park | G01R 31/392 |
| 2019/0170827 | A1 * | 6/2019 | Shoa Hassani Lashidani | G01R 31/392 |
| 2019/0209022 | A1 * | 7/2019 | Sobol | A61B 5/0022 |
| 2019/0369165 | A1 * | 12/2019 | Kosugi | H01M 10/48 |
| 2020/0233036 | A1 | 7/2020 | Kosugi et al. | |
| 2020/0278398 | A1 * | 9/2020 | Isa | G01R 31/389 |
| 2020/0393518 | A1 * | 12/2020 | Takegami | G01R 31/367 |
| 2021/0048482 | A1 | 2/2021 | Ukumori | |
| 2021/0286009 | A1 * | 9/2021 | Kajitani | H02J 7/00036 |

FOREIGN PATENT DOCUMENTS

| | | | |
|---|---|---|---|
| JP | 2008-232758 | A | 10/2008 |
| JP | 2013-003115 | A | 1/2013 |
| JP | 2014-176175 | A | 9/2014 |
| JP | 2017-004955 | A | 1/2017 |
| JP | 6555440 | B1 | 8/2019 |
| WO | WO-2018/150631 | A1 | 8/2018 |

OTHER PUBLICATIONS

M. Baumann, S. Rohr and M. Lienkamp, "Cloud-connected battery management for decision making on second-life of electric vehicle batteries," 2018 Thirteenth International Conference on Ecological Vehicles and Renewable Energies (EVER), Monte Carlo, Monaco, 2018, pp. 1-6, doi: 10.1109/EVER.2018.8362355. (Year: 2018).*

J. D. Kozlowski, C. S. Byington, A. K. Garga, M. J. Watson and T. A. Hay, "Model-based predictive diagnostics for electrochemical energy sources," 2001 IEEE Aerospace Conference Proceedings (Cat. No.01TH8542), Big Sky, MT, USA, 2001, pp. 3149-3164 vol. 6, doi: 10.1109/AERO.2001.931332. (Year: 2001).*

M. Albu, A. Nechifor and D. Creanga, "Smart storage for active distribution networks estimation and measurement solutions," 2010 IEEE Instrumentation & Measurement Technology Conference Proceedings, Austin, TX, USA, 2010, pp. 1486-1491, doi: 10.1109/IMTC.2010.5488083. (Year: 2010).*

International Searching Authority, International Search Report and Written Opinion for International Application No. PCT/JP2019/049972, dated Jan. 28, 2020, (9 pages), Japan Patent Office, Tokyo, Japan.

* cited by examiner

DATA PROCESSOR, DATA PROCESSING METHOD, AND COMPUTER PROGRAM

CROSS REFERENCE TO RELATED APPLICATIONS

This application is a national stage application, filed under 35 U.S.C. § 371, of International Application No. PCT/JP2019/049972, filed Dec. 20, 2019, which international application further claims priority to Japan Application No. 2018-248109, filed Dec. 28, 2018; the contents of both of which as are hereby incorporated by reference in their entireties.

BACKGROUND

Technical Field

The present invention relates to a data processor, a data processing method, and a computer program for performing calculation using measurement data relating to an energy storage device group.

Description of Related Art

Energy storage devices are widely in use for uninterruptible power systems, d.c. or a.c. power systems included in stabilized power supplies, and the like. In addition, the use of energy storage devices in a large-scale system, which stores power generated by renewable energy or the existing power generating system, is expanding.

In a system using an energy storage device, maintenance activities are important, the activities including the implementation of the state diagnosis, the estimation of the state of charge (SOC), the life prediction, and the like of the energy storage device. Methods for the state diagnosis, estimation, or the life prediction of the energy storage device have been proposed in various ways, including a method using measurement data such as voltage, current, and temperature measured at the time of charging and discharging the energy storage device, to improve accuracy (e.g., JP-A-2013-003115).

BRIEF SUMMARY

The method for the state diagnosis, estimation, or the life prediction of the energy storage device as described above has been established on the basis of an energy storage device model assumed at the time of manufacturing. However, respective energy storage devices have respective property of a material, variations in manufacturing, and the like, and exhibit an oddity deviating from the property of the energy storage device model due to the lapse of time or the use environment. For example, an energy storage device having characteristics similar to those of other energy storage devices at the time of manufacturing may have a significantly longer life or a significantly shorter life than an assumed model. Energy storage devices have a property that the full charge capacity is lowered by repetition of charge and discharge. When a new energy storage device or an energy storage device having a different history is added to an energy storage device group having similar charge-discharge histories in the same period, the new energy storage device or the energy storage device having a different history is odd for the energy storage device group. The degree of oddity expressed by a quantitative scale by a determination model is referred to as an oddity degree.

When the state diagnosis, estimation, or the life prediction of an entire system, which uses an enormous amount of connected energy storage devices, is performed, an error in the diagnosis, estimation, or prediction increases in a case where measurement data of an odd energy storage device is included in the measurement data of the energy storage device group.

It is an object of the present invention to provide a data processor, a data processing method, and a computer program for improving accuracy in diagnosis, estimation, and prediction of an energy storage device based on measurement data relating to the energy storage device.

A data processor processes measurement data for an energy storage device and includes: a storage part that stores a determination model learned to output a score, which corresponds to whether or not measurement data of an odd energy storage device are included in measurement data measured for each energy storage device or for each energy storage device group grouped from a plurality of the energy storage devices, when the measurement data is input; and a determination part that determines measurement data of an odd energy storage device on the basis of a score output by inputting the acquired measurement data into the determination model.

DETAILED DESCRIPTION OF VARIOUS EMBODIMENTS

Figure 1:
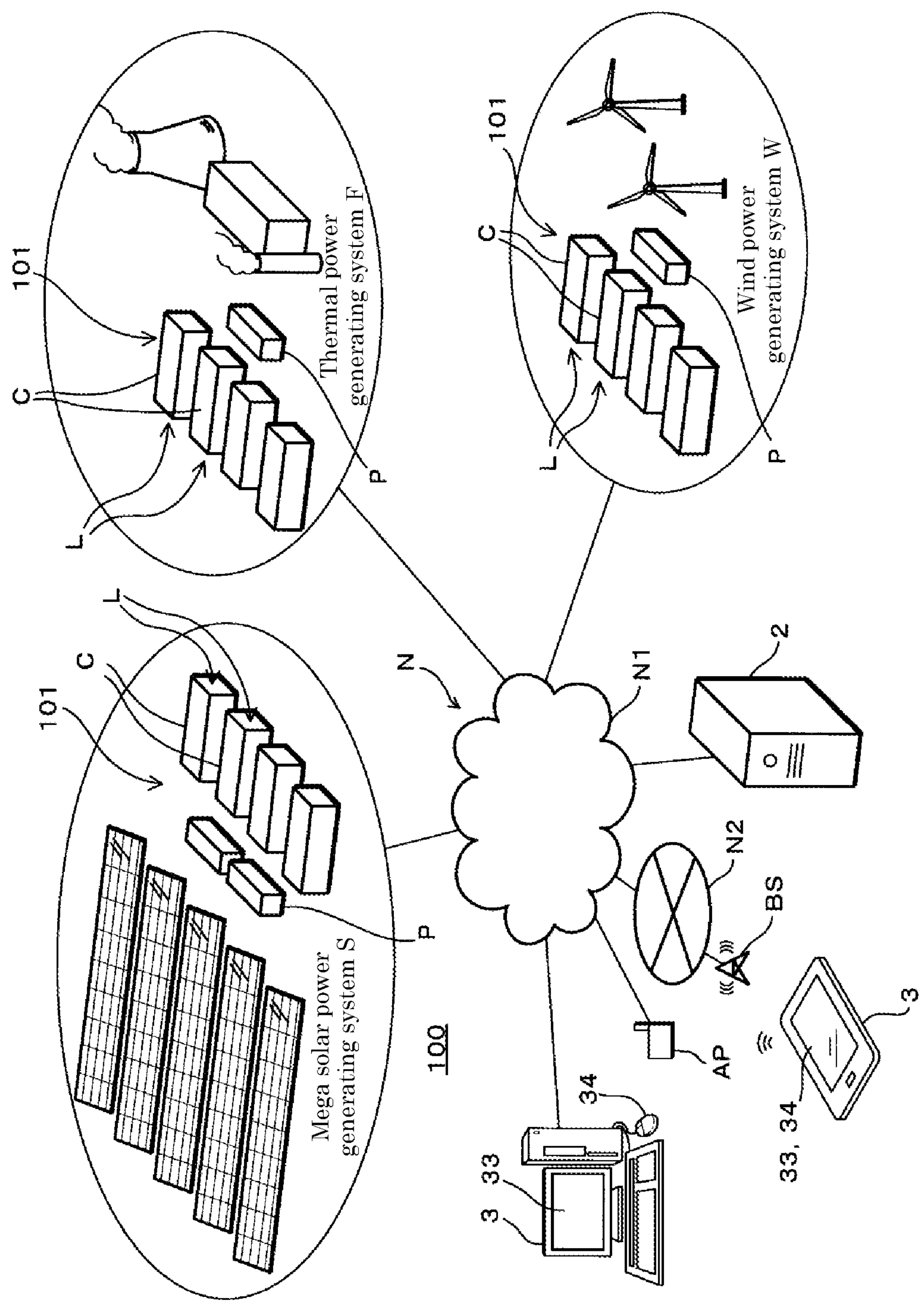
FIG. 1 is a diagram showing an outline of a remote monitoring system.

A data processor processes measurement data for an energy storage device and includes: a storage part that stores a determination model learned to output a score, which corresponds to whether or not measurement data of an odd energy storage device are included in measurement data measured for each energy storage device or for each energy storage device group grouped from a plurality of the energy storage devices, when the measurement data is input; and a determination part that determines measurement data of an odd energy storage device on the basis of a score output by inputting the acquired measurement data into the determination model.

With the above configuration, it is possible to perform processing using the remaining measurement data excluding the measurement data of the odd energy storage device.

The processing using the remaining measurement data is, for example, processing of state diagnosis including the presence or absence of the abnormality of the energy storage device, estimation of the deterioration state, or life prediction. By excluding the measurement data of the odd energy storage device, it is possible to improve the accuracy in the above processing, established on the basis of the energy storage device model assumed at the time of manufacturing.

A determination model used for determining measurement data of an odd energy storage device has been learned for each attribute of the measurement data, for example, for each type of data relating to an energy storage device model assumed at the time of manufacturing such as voltage, current, or temperature. There is a possibility that measurement data of different attributes may be affected by the oddity of how the device is odd, such as whether the device is new, has a long life, has a short life, or has other properties which are different, the oddity is determined with high accuracy by determining each attribute.

In addition to a method for intermittently determining whether or not measurement data of an odd energy storage device is included in each measurement data on the basis of the output itself of the determination model, it may be determined whether or not the measurement data of the odd energy storage device is included by using the change with time of the output. In this case, it is possible to avoid determining measurement data of an energy storage device, which is balanced and matched with other energy storage devices with time, as the measurement data of the odd energy storage device by mistake or prematurely.

The determination as to whether or not the measurement data of the odd energy storage device is included with respect to the time distribution of the output of the determination model may be performed on the basis of a determination by an operator until the data is collected sufficiently. The pattern of the time distribution may be analyzed in advance, and it may be accurately determined whether or not the measurement data of the odd energy storage device is included depending on which pattern applies. The determination may be made using a classifier model that inputs an image obtained by imaging the pattern of the time distribution and outputs whether or not the measurement data of the odd energy storage device is included.

The determination model is adapted to characteristics of an energy storage device to be actually operated by being re-learned using the remaining measurement data except for the measurement data determined as being odd.

The determination model may be re-learned when the measurement data determined as being odd is equal to or more than a predetermined ratio of the total. For an energy storage device having a capacity or the like changing with the passage of time, the determination model can also be changed with time.

A data processing method is for processing measurement data of an energy storage devices in which, by using a determination model learned to output a score, which corresponds to whether or not measurement data of an odd energy storage device are included in measurement data measured for each energy storage device or for each energy storage device group grouped from a plurality of the energy storage devices, when the measurement data is input, the measurement data of the odd energy storage device is determined on the basis of a score output by inputting the acquired measurement data into the determination model.

A computer program causes a computer to execute processing of using a determination model learned to output a score, which corresponds to whether or not measurement data of an odd energy storage device are included in measurement data measured for each energy storage device or for each energy storage device group grouped from a plurality of the energy storage devices, when the measurement data is input, determining measurement data of an odd energy storage device on the basis of a score output by inputting the acquired measurement data into the determination model.

The present invention will be specifically described with reference to the drawings showing embodiments thereof.

FIG. 1 is a diagram showing an outline of a remote monitoring system 100. The remote monitoring system 100 enables remote access to information on an energy storage device group included in the mega solar power generating system S, the thermal power generating system F, and the wind power generating system W.

The mega solar power generating system S, the thermal power generating system F, and the wind power generating system W are juxtaposed with a power conditioner (power conditioning system: PCS) P and an energy storage system 101. The energy storage system 101 is configured by juxtaposing a plurality of containers C each housing an energy storage module group L. The energy storage module group L includes a plurality of energy storage devices. The energy storage device is preferably rechargeable device, such as a secondary battery like a lead-acid battery or a lithium ion battery, or a capacitor. A part of the energy storage device may be a primary battery that is not rechargeable.

Figure 2:
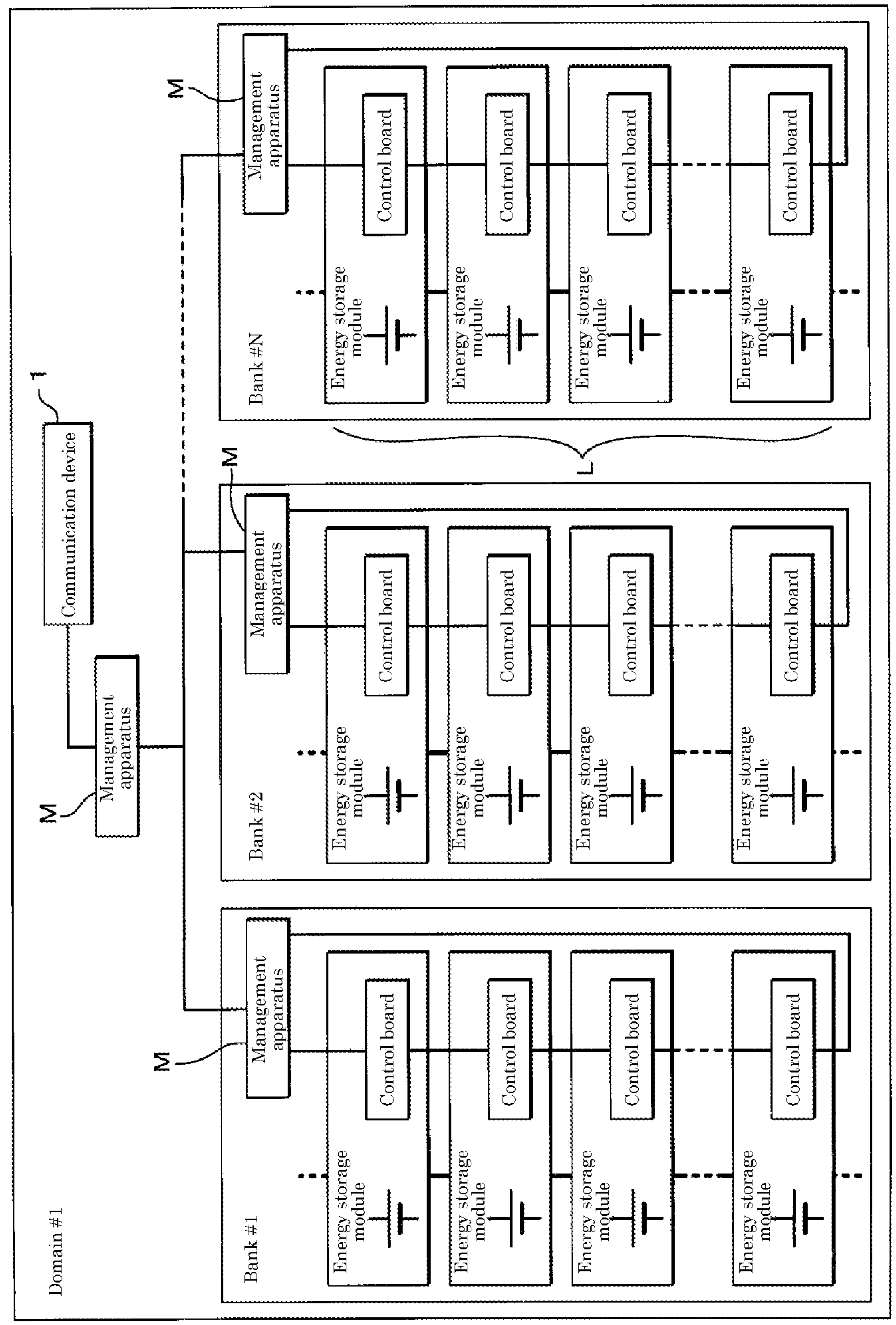
FIG. 2 is a diagram showing an example of a hierarchical structure of an energy storage module group and a connection form of a communication device.

In the remote monitoring system 100, a communication device 1 is mounted on/connected to each of the energy storage systems 101 or apparatuses (P and a management apparatus M to be described later) in the power generating systems S, F, W to be monitored (cf. FIGS. 2 and 3). The remote monitoring system 100 includes the communication device 1, a server apparatus 2 (data processor) for collecting information from the communication device 1, a client apparatus 3 for browsing the collected information, and a network N that is a communication medium between the apparatuses.

The communication device 1 may be a terminal apparatus (measurement monitor) that communicates with a battery management unit (BMU) provided in the energy storage device and receives information of the energy storage device or may be an ECHONET/ECHONETLite (registered trademark) compatible controller. The communication device 1 may be an independent device or may be a network card type device that can be mounted on the power conditioner P or an energy storage module group L. The communication devices 1 are provided one by one for each group made up of a plurality of energy storage modules in order to acquire the information of the energy storage module group L in the energy storage system 101. A plurality of power conditioners P are connected to enable serial communication, and the communication device 1 is connected to the control unit of the power conditioner P, which is representative of any of them.

The server apparatus 2 includes a Web server function, and presents information obtained from a communication device 1 mounted on/connected to each device to be monitored in response to access from the client apparatus 3.

The network N includes a public communication network N1, which is the so-called Internet, and a carrier network N2, which achieves wireless communication according to a predetermined mobile communication standard. The public communication network N1 includes a general optical line, and the network N includes a dedicated line to which the server apparatus 2 is connected. The network N may include an ECHONET/ECHONET Lite compatible network. The carrier network N2 includes a base station BS, and the client apparatus 3 can communicate with the server apparatus 2 from the base station BS via the network N. An access point AP is connected to the public communication network N1, and the client apparatus 3 can transmit and receive information to and from the server apparatus 2 via the network N from the access point AP.

The energy storage module group L of the energy storage system 101 has a hierarchical structure. The communication device 1 for transmitting information of an energy storage device to the server apparatus 2 acquires information of an energy storage module group from the management apparatus M provided in the energy storage module group L. FIG. 2 is a diagram showing an example of the hierarchical structure of the energy storage module group L and the connection form of the communication device 1. The energy storage module group L has a hierarchical structure of, for example, an energy storage module (also called a module) in which a plurality of energy storage devices (also referred to as energy storage cells or cells, and a plurality of electrode assemblies (elements) may exist in the energy storage element) are connected in series, a bank in which a plurality of energy storage modules are connected in series, and a domain in which a plurality of banks are connected in parallel. In the example of FIG. 2, the management apparatuses M are provided one for each of the banks numbered (#)1-N and the domain in which the banks are connected in parallel. The management apparatus M provided for each bank communicates with a control board (cell monitoring unit (CMU)) with a communication function built in each energy storage module by serial communication to acquire measurement data (voltage, current, temperature, etc.) for the energy storage cell in the energy storage module. A bank management apparatus M performs balance adjustment for each bank based on the acquired measurement data for each energy storage cell and executes management processing such as detection of the abnormality of the communication state. Each management apparatus M of each bank transmits measurement data obtained from the energy storage modules of each bank to the management apparatus M provided in units of domains. The bank management apparatus M transmits the state of the balance adjustment of the energy storage module to the domain management apparatus M and notifies the domain management apparatus M when an abnormality is detected. A domain management apparatus M aggregates information such as measurement data obtained from the management apparatus M of the bank belonging to the domain and the detected abnormality. In the example of FIG. 2, the communication device 1 is connected to the management apparatus M for each domain. Note that the domain management apparatus M and the bank management apparatus M may be the same (an integrated management apparatus M).

Figure 3:
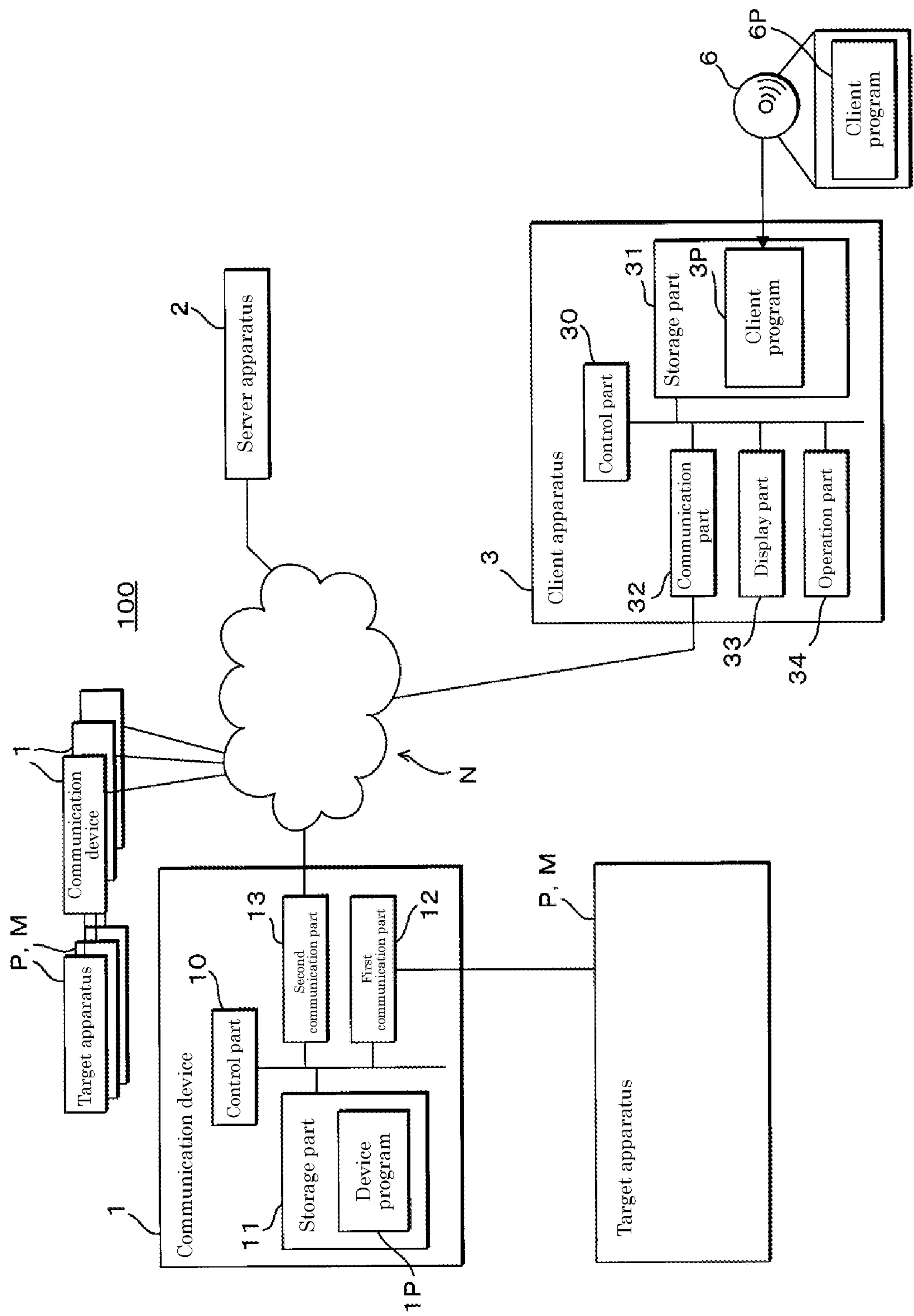
FIG. 3 is a block diagram showing an internal configuration of an apparatus included in a remote monitoring system.
Figure 4:
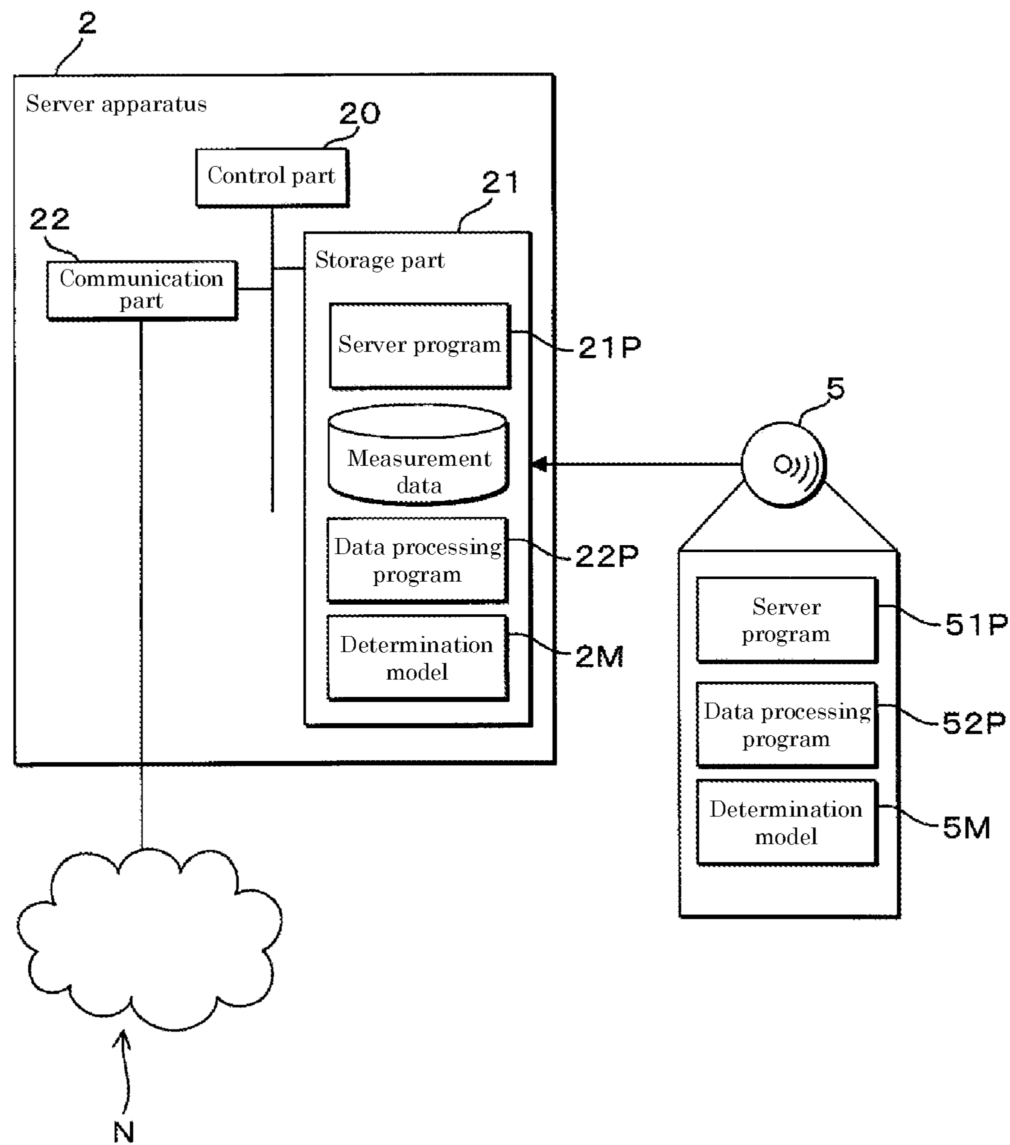
FIG. 4 is a block diagram showing the detail of the internal configuration of the apparatus included in the remote monitoring system.

FIGS. 3 and 4 are block diagrams showing the internal configurations of the apparatuses included in the remote monitoring system 100. As shown in FIG. 3, the communication device 1 includes a control part 10, a storage part 11, a first communication part 12, and a second communication part 13. The control part 10 is a processor using a central processing unit (CPU) and uses built-in memories such as read-only memory (ROM) and random-access memory (RAM) to control each component part and execute processing.

The storage part 11 uses a nonvolatile memory such as a flash memory. The storage part 11 stores a device program to be read and executed by the control part 10. The device program 1P includes a communicating program conforming to Secure Shell (SSH), Simple Network Management Protocol (SNMP), or the like. The storage part 11 stores information such as information collected by the processing of the control part 10 and event logs. The information stored in the storage part 11 can also be read via a communication interface, such as a universal serial bus (USB) having a terminal exposed to a casing of the communication device 1.

The first communication part 12 is a communication interface that achieves communication with a monitoring target apparatus to which the communication device 1 is connected. For the first communication part 12 uses, for example, a serial communication interface, such as RS-232C or RS-485, is used. For example, the power conditioner P includes a control unit having a serial communication function conforming to the RS-485, and the first communication part 12 communicates with the control unit. When a control board provided in the energy storage module group L is connected by a Controller Area Network (CAN) bus, and the communication between the control board is achieved by CAN communication, the first communication part 12 is a communication interface based on a CAN protocol. The first communication part 12 may be a communication interface corresponding to the ECHONET/ECHONETLite standard.

The second communication part 13 is an interface for achieving communication via the network N and uses, for example, a communication interface such as an Ethernet (registered trademark) or a wireless communication antenna. The control part 10 can communicate and connects with the server apparatus 2 via the second communication part 13. The second communication part 13 may be a communication interface corresponding to the ECHONET/ECHONETLite standard.

In the communication device 1 configured as described above, the control part 10 acquires, via the first communication part 12, measurement data for an energy storage device obtained in the apparatus to which the communication device 1 is connected. By reading and executing an SNMP program, the control part 10 can also function as an SNMP agent and respond to an information request from the server apparatus 2.

The client apparatus 3 is a computer used by an operator such as an administrator or a person in charge of maintenance of the energy storage system 101 of the power generating systems S, F, W. The client apparatus 3 may be a desktop type or a laptop type personal computer or may be a smartphone a so-called smartphone or tablet communication terminal. The client apparatus 3 includes a control part 30, a storage part 31, a communication part 32, a display part 33, and an operation part 34.

The control part 30 is a processor using a CPU. The control part 30 causes the display part 33 to display a Web page provided by the server apparatus 2 or the communication device 1 on the basis of a client program 3P including a Web browser stored in the storage part 31.

The storage part 31 uses a nonvolatile memory such as a hard disk or a flash memory. The storage part 31 stores various programs that include the client program 3P. The client program 3P may be a program obtained by reading a client program 6P stored in advance in a recording medium 6 and copying the program to the storage part 31.

The communication part 32 uses a communication device, such as a network card for wired communication, a wireless communication device for mobile communication connected to a base station BS (cf. FIG. 1), or a wireless communication device corresponding to connection to the access point AP. The control part 30 can communicatively connect with, or transmit and receive information to and from, the server apparatus 2 or the communication device 1 via the network N by using the communication part 32.

The display part 33 uses a display such as a liquid crystal display or an organic electroluminescence (EL) display. The display part 33 displays the image of the Web page provided by the server apparatus 2 or the communication device 1 by the processing based on the client program 3P of the control part 30. The display part 33 is preferably a display with a built-in touch panel but may be a display without a built-in touch panel.

The operation part 34 is a user interface, such as a keyboard and a pointing device, capable of input and output with the control part 30 or a voice input part. The touch panel of the display part 33 or a physical button provided in the housing may be used for the operation part 34. The operation part 34 notifies the control part 30 of information of an operation by the user.

As shown in FIG. 4, the server apparatus 2 uses a server computer and includes a control part 20, a storage part 21 and a communication part 22. Although the server apparatus 2 is described as one server computer in the present embodiment, the processing may be distributed among a plurality of server computers.

The control part 20 is a processor using a CPU or a graphics processing unit (GPU) and uses built-in memories such as ROM and RAM to control each component part and execute processing. The control part 20 executes communication and information processing based on a server program 21P stored in the storage part 21. The server program 21P includes a Web server program, and the control part 20 functions as a Web server that performs provision of a Web page to the client apparatus 3. The control part 20 collects information from the communication device 1 as an SNMP server on the basis of the server program 21P. The control part 20 executes data processing on measurement data collected on the basis of a data processing program 22P stored in the storage part 21.

The storage part 21 uses a nonvolatile memory such as a hard disk or a flash memory. The storage part 21 stores the server program 21P and the data processing program 22P described above. The storage part 21 stores a determination model 2M used in processing based on the data processing program 22P. The storage part 21 stores measurement data of each of the power conditioner P and the energy storage module group L of the energy storage system 101 to be monitored, which is collected by the processing of the control part 20.

The server program 21P, the data processing program 22P and the determination model 2M stored in the storage part 21 may be those obtained by reading a server program 51P, the data processing program 52P, and a determination model 5M stored in the recording medium 5 and replicating them in the storage part 21.

The communication part 22 is a communication device that achieves the communication connection and the transmission and reception of information via the network N. Specifically, the communication part 22 is a network card corresponding to the network N.

In the remote monitoring system 100 configured as described above, at each predetermined timing (e.g., at each fixed cycle, when the amount of data satisfies a predetermined condition, etc.), the communication device 1 transmits measurement data and other information for each energy storage cell, acquired from the management apparatus M after the previous timing and stored, to the server apparatus 2. The communication device 1 transmits measurement data in association with identification information (number) of an energy storage cell. The communication device 1 may transmit all the sampling data obtained through the management apparatus M, may transmit measurement data thinned at a predetermined rate, or may transmit an average value. The server apparatus 2 acquires information including measurement data from the communication device 1 and stores the acquired measurement data into a storage part 21 in association with the acquisition time information and information for identifying the apparatus (M, P) of the acquisition source of the information.

The server apparatus 2 can present the latest data among the stored measurement data for each energy storage cell of the energy storage system 101 in accordance with access from the client apparatus 3. The server apparatus 2 can also present the state of each bank or domain for each energy storage module by using measurement data for each energy storage cell. On the basis of the data processing program 22P, the server apparatus 2 can execute the abnormality diagnosis and health diagnosis of the energy storage system 101, the estimation of SOC, the state of health (SOH), or the like of the energy storage module, or the life prediction by using the measurement data, and can present the execution result.

The server apparatus 2 in the present disclosure determines measurement data of an odd energy storage cell from the measurement data of the energy storage cell on the basis of the data processing program 22P and the determination model 2M when performing the diagnosis, estimation, or prediction processing. The server apparatus 2 performs the diagnosis, estimation, or prediction for each energy storage module, bank, or domain by using other measurement data excluding the determined measurement data.

Figure 5:
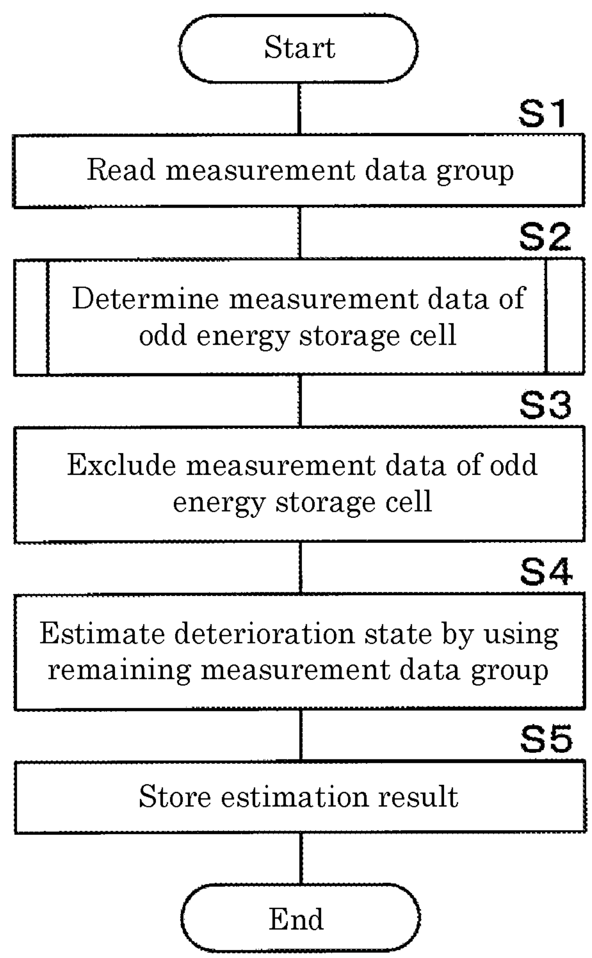
FIG. 5 is a flowchart showing an example of a data processing procedure performed by a server apparatus.

FIG. 5 is a flowchart showing an example of a data processing procedure performed by the server apparatus 2. The control part 20 of the server apparatus 2 cyclically executes a processing procedure shown below for each target energy storage device group. The execution cycle is longer than the cycle of transmission of the measurement data from the communication device 1. In the following description, the energy storage device group to be described is a bank connecting a plurality of modules, a domain including a plurality of banks in parallel, and the energy storage system 101 including a plurality of domains. As an example, the large-scale energy storage system 101 includes a bank in which 12 modules each including 12 energy storage cells are connected in series, and ten banks in each of eight domains. In this case, the number of energy storage cells is about 12000.

The control part 20 reads the measurement data group stored in association with the time information for each energy storage cell included in the energy storage system 101 to be processed (step S1) and determines measurement data of an odd energy storage cell in the read measurement data group (step S2).

The control part 20 excludes the determined measurement data from the read measurement data group (step S3) and executes estimation processing for the deterioration state (SOH) of the entire energy storage system 101 by using the remaining measurement data group (step S4). The control part 20 stores the result of the estimation processing in step S4 into the storage part 21 in association with time information obtained by acquiring the latest data in the measurement data group and information for identifying the energy storage system 101 (step S5) and ends the processing.

As shown in the flowchart of FIG. 5, in the present embodiment, the estimation processing for the deterioration state is performed on the basis of data obtained by excluding the measurement data of the odd energy storage cell. In the large-scale energy storage system 101 including a plurality of domains in which banks with many energy storage cells connected in series are connected in parallel, the accuracy of the processing result is improved by excluding the measurement data of the odd energy storage cell from the energy storage cell group and performing the estimation processing for the deterioration state of the energy storage cell group to be the life in accordance with an assumed model.

Figure 6:
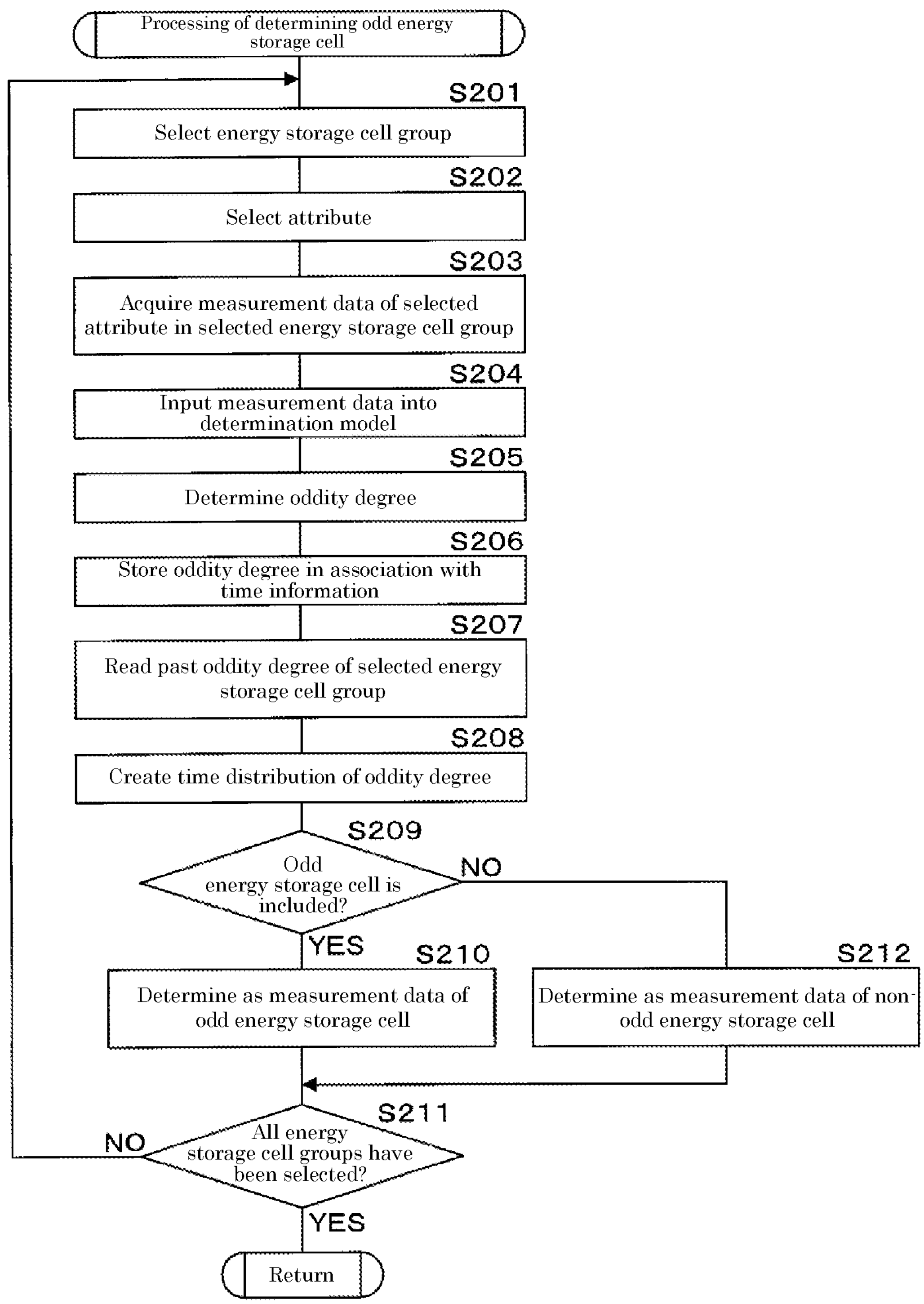
FIG. 6 is a flowchart showing an example of processing of determining an odd energy storage cell.

FIG. 6 is a flowchart showing an example of the processing of determining the odd energy storage cell. The flowchart of FIG. 6 corresponds to the detail of step S2 in the flowchart of FIG. 5. That is, the processing procedure shown in the flowchart of FIG. 6 is repeatedly executed cyclically. In the example shown in the flowchart of FIG. 6, the control part 20 performs the determination by determining, in units of energy storage cell groups including odd energy storage cells, whether or not the energy storage cell group includes an odd energy storage cell.

The control part 20 selects one energy storage cell group (step S201). In step S201, the control part 20 selects the energy storage cell group in units of modules, that is, selects the identification information of the module.

The control part 20 selects the attribute of the target measurement data (step S202). The attribute is, for example, a type of measurement data such as voltage, current, or temperature. The attribute is not limited thereto but may be other data that can be measured in units of energy storage cells or modules.

For each of a plurality of energy storage cells included in the energy storage cell group selected in step S201, the control part 20 acquires the latest measurement data of the attribute selected in step S202 (step S203). The measurement data acquired in step S203 may be acquired by thinning out the measurement data having been read in step S1 of FIG. 5 at intervals corresponding to the length of the past predetermined period, which will be described later.

The measurement data acquired in step S203 is input into the determination model 2M for each attribute (step S204), and the oddity degree output from the determination model 2M is determined (step S205).

The control part 20 stores the oddity degree determined in step S205 into the storage part 21 in association with the information for identifying the energy storage cell group selected in step S201 and the time information of the acquired measurement data (step S206).

The control part 20 reads the oddity degree of the energy storage cell group selected in step S201 in the past predetermined period stored in the storage part 21 (step S207). The control part 20 creates a time distribution of the oddity degree of the past predetermined period (step S208).

The control part 20 determines whether or not the energy storage cell group selected in step S207 includes an odd energy storage cell on the basis of the value of the oddity degree read in step S201, the time distribution created in step S208, and/or the measurement data of the selected energy storage cell group (step S209).

When it is determined that the energy storage cell group includes odd energy storage cells (S209: YES), the control part 20 determines that the measurement data of the energy storage cell group selected in step S201 is the measurement data of the odd energy storage cell (step S210). The control part 20 determines whether or not all the energy storage cell groups have been selected in step S201 (step S211), and when it is determined that all the energy storage cell groups have been selected (step S211: YES), the control part 20 returns the processing to step S3 in the flowchart of FIG. 5.

When it is determined in step S209 that an odd energy storage cell is not included (step S209: NO), the control part 20 determines that the measurement data is not measurement data of an odd energy storage cell (step S212) and advances the processing to step S211.

When it is determined in step S211 that all the energy storage cell groups have not been selected (step S211: NO), the control part 20 returns the processing to step S201 and selects the next storage cell group (step S201).

In the flowchart of FIG. 6, the control part 20 determines whether or not the energy storage cell includes an odd energy storage cell in units of modules in which the energy storage cells are connected in series. However, the present invention is not limited thereto, and the unit of the energy storage cell group to be determined may be determined in accordance with the design of the determination model 2M. For example, the determination may be made in units of banks or may be made for each energy storage cell.

Figure 7:
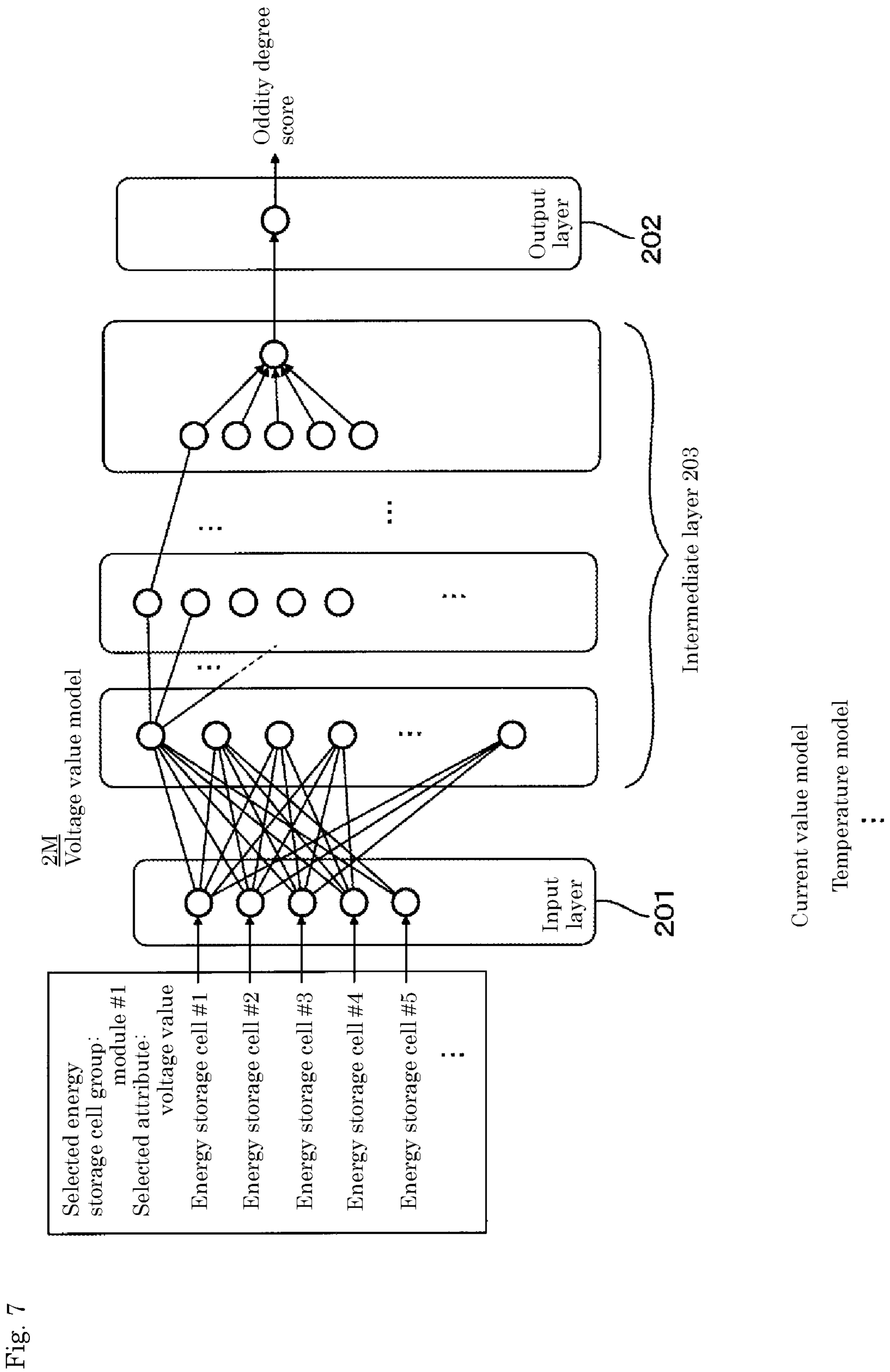
FIG. 7 is a schematic view of an example of a determination model.

A method for determining the oddity degree by using the determination model 2M in steps S204 and S205 will be described. FIG. 7 is a schematic view of an example of the determination model 2M. In one example, the determination model 2M is a classifier that uses a convolutional neural network to classify an energy storage cell group including a standard energy storage cell that is not odd and other energy storage cell groups each including odd energy storage cells. In an example shown in FIG. 7, the determination model 2M includes an input layer 201 for inputting a voltage value of each energy storage cell of the selected energy storage cell group, an output layer 202 for outputting a score relating to the oddity degree based on the input voltage value, and an intermediate layer 203 including a convolution layer or a pooling layer. The determination model 2M has provided a neural network with teacher data including measurement data attached with a label (e.g., "0") which is a standard energy storage cell being not odd and measurement data attached with an odd label (e.g., "1") and learned for each attribute of the measurement data. In the example of FIG. 7, an attribute called a voltage value measured in each energy storage cell has been learned. The determination model 2M outputs, from the output layer 202, a score (a numerical value between 0 and 1) of the oddity degree for the given measurement data classified as being odd.

The determination model 2M is not limited to a classifier but may be a convolutional neural network that outputs a feature amount. The determination model 2M may be formed of a network using a recurrent neural network that inputs time-series data of measurement data of the same energy storage cell and outputs a feature amount, long short-term memory (LSTM), or the like.

The teacher data of the determination model 2M may be classified not only by attribute but may also be classified in advance by the environment of the target energy storage system 101 of the measurement data, the type of the power generating system connected to the energy storage system 101, or the type of the load at the output destination from the energy storage system 101. The determination model 2M is classified into a plurality of different determination models 2Ma, 2Mb, . . . by the classified teacher data, and a model is selected in accordance with the type relating to the energy storage cell to be determined.

The control part 20 may re-learn the determination model 2M by the measurement data group excluding the odd measurement data determined by the processing procedure shown in the flowchart of FIG. 6. In another example, when the ratio of the odd measurement data determined by the processing procedure shown in the flowchart of FIG. 6 to the measurement data of the entire storage cell group exceeds a predetermined ratio (e.g., 20%), the control part 20 may re-learn the determination model 2M, assuming that the entire measurement data is the measurement data of the energy storage cell group not including an odd energy storage cell. As a result, it is expected that the determination model 2M changes with time along with the change with time of the entire energy storage system 101 including the energy storage cell group, erroneous determination is avoided, and an appropriate determination is made for the appearance of a different, odd energy storage cell that appears with time. When the determination model 2M changes with time, the determination model 2M may be stored into another nonvolatile storage medium in accordance with the elapsed years of one year and two years and applied to the change with time of another energy storage system 101.

In another example, the determination model 2M may be a model for statistically calculating whether or not measurement data to be an outlier is included, and the degree of outliers when included, by using the average, standard deviation, median, or the like of the measurement data. In another example, the determination model 2M may be a model for obtaining a trend by the time-series data of the measurement data and outputting a score representing the oddity degree by the difference of the trend. In another example, the k-nearest neighbor algorithm may be used for the determination model 2M, and the control part 20 may determine whether the target measurement data belongs to a non-odd class or an odd class, learned in advance on the basis of the teacher data. In another example, the k-average algorithm or the expectation-maximization (EM) algorithm may be used for the determination model 2M, and the control part 20 may make a determination by clustering on the basis of the determination model 2M (determination program). In another example, the principal component analysis (PCA) may be used for the determination model 2M (determination program), and the control part 20 may make a determination in a contracted manner as to whether or not the target measurement data is odd.

A detailed description will be given of a procedure for determining whether or not an odd energy storage cell is included, among the processing procedures shown in the flowchart of FIG. 6, based on the value of the oddity degree, the time distribution, and/or the measurement data of the selected energy storage cell group in step S209.

Figure 8:
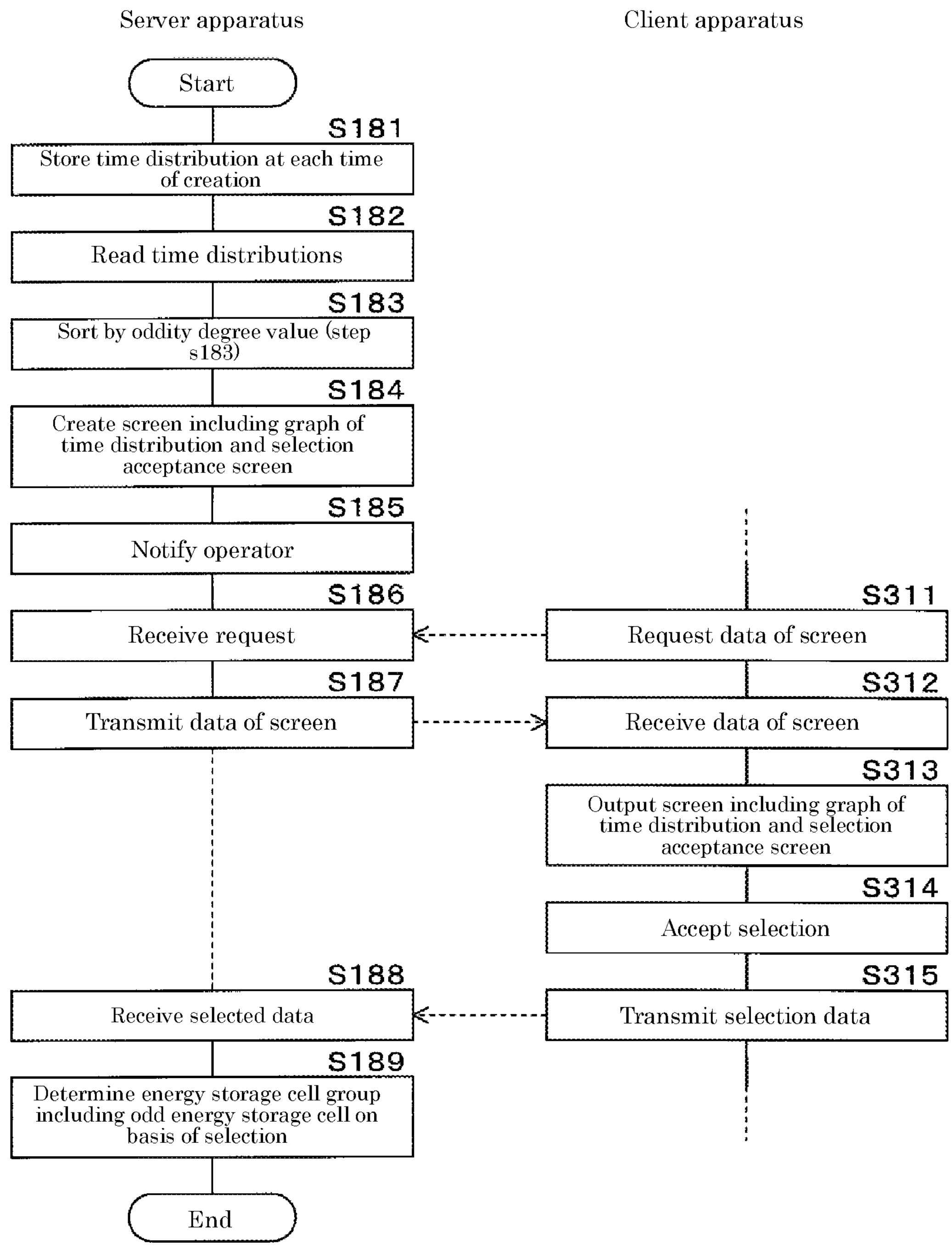
FIG. 8 is a flowchart showing a procedure for determining whether or not an energy storage cell is included in a first example.

In a first example, the control part 20 graphically outputs the time distribution of the oddity degree created for each selected energy storage cell group and accepts a determination by the operator as to whether or not an odd energy storage cell is included. FIG. 8 is a flowchart showing a procedure for determining whether or not an energy storage cell is included in a first example.

Each time the control part 20 of the server apparatus 2 creates a time distribution for each energy storage cell group (module) in step S208, the control part 20 stores the time distribution into the storage part 21 in association with the time information (step S181). After it is determined in step S211 that all the energy storage cell groups have been selected, the control part 20 reads the time distributions of all the energy storage cell groups stored in the storage part 21 (step S182).

The control part 20 sorts the time distribution of each of the read energy storage cell groups in terms of the maximum value or the average value of the oddity degree in descending order (step S183).

The control part 20 sequentially graphs the time distribution for each of the sorted energy storage cell groups, that is, the distribution of the oddity degree with respect to the passage of time, creates data of a screen including a selection acceptance screen indicating whether or not to an odd energy storage cell is included for each graph (step S184), and notifies the operator (step S185). The screen created in step S184 includes data of measurement data (voltage value, current value, and temperature value) for each energy storage cell group. The screen created in step S184 may not include the time distribution of the energy storage cell group, in which the maximum value or the average value of the oddity degree is less than a predetermined value and an odd energy storage cell is unlikely to be included, among the sorted time distributions. It is determined that the energy storage cell group in which the maximum value or the average value of the oddity degree is less than a predetermined value does not include an odd energy storage cell.

When the notified operator uses the client apparatus 3 to access the server apparatus 2 by using the log-in information of the operator, the control part 30 of the client apparatus 3 requests the data of the screen to the server apparatus 2 (step S311).

The control part 20 of the server apparatus 2 receives the request (step S186) and transmits the data of the screen created in step S184 to the client apparatus 3 in response to the request (step S187). In step S187, the control part 20 transmits the data of the screen for the time distribution of the oddity degree created on the basis of the latest measurement data. The control part 20 may transmit data of a screen for a time distribution created so far at each of a plurality of time points.

In the client apparatus 3 used by the operator, the control part 30 receives the data of the screen (step S312), draws a graph of the time distribution of the oddity degree for each energy storage cell group (module) on the basis of the received data, and outputs the graph to the display part 33 together with the selection acceptance screen (step S313).

The operator visually recognizes the graph of the time distribution of the oddity degree of the energy storage cell group sorted in descending order of the maximum value or the average value of the oddity degree in the display part 33 and analyzes measurement data displayed in a screen together to determine whether or not an odd cell is included. The operator reflects the result of determination as to whether or not an odd energy storage cell is included on the selection acceptance screen.

The control part 30 accepts, on the selection acceptance screen, the operator's selection for each energy storage cell group as to whether or not an odd energy storage cell is included (step S314) and transmits the accepted selection data to the server apparatus 2 (step S315).

The control part 20 of the server apparatus 2 receives the selected data (step S188), determines whether or not an odd energy storage cell is included for each energy storage cell group on the basis of the operator's selection indicated by the data (step S189) and ends the processing.

In step S189, the control part 20 may determine that the energy storage cell group, in which whether or not an odd energy storage cell is included has not been selected, does not include an odd energy storage cell.

Figure 9:
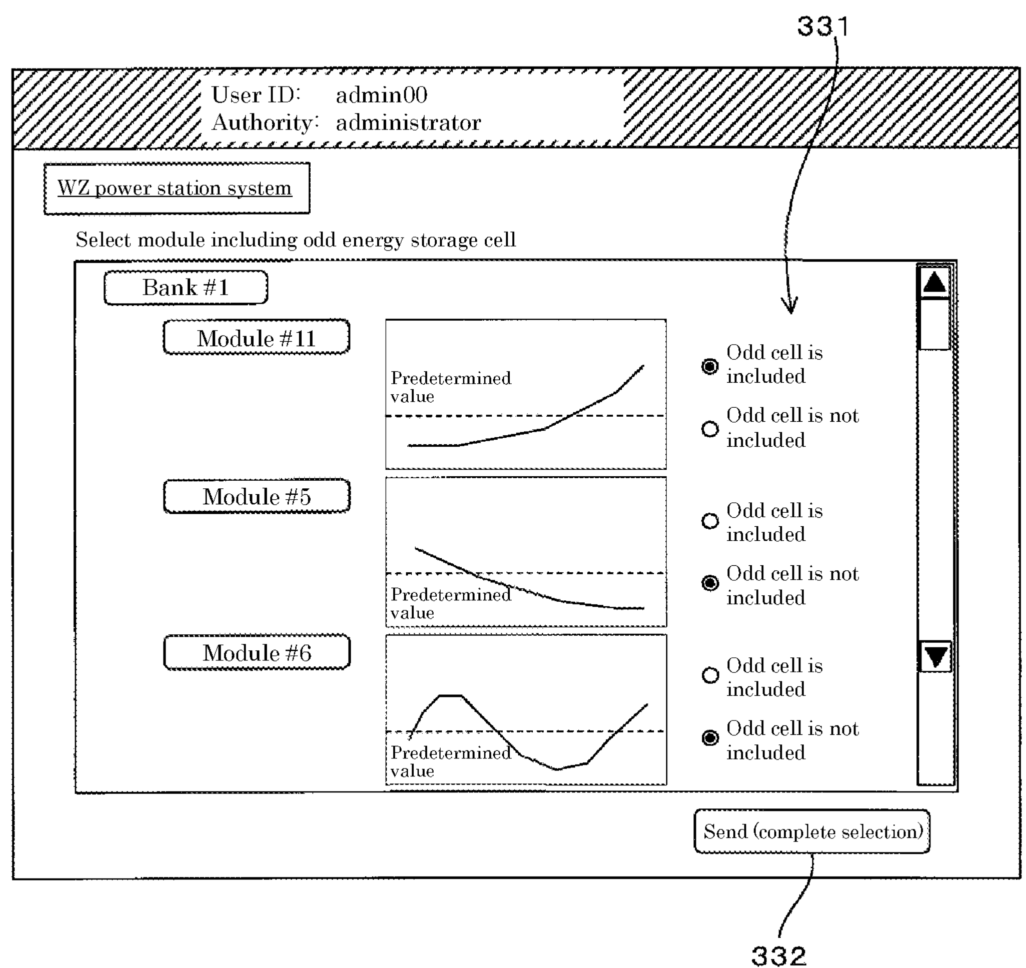
FIG. 9 is an example of a screen including a graph of a time distribution of the oddity degree.

FIG. 9 is an example of the screen including the graph of the time distribution of the oddity degree. As shown in FIG. 9, the time distribution of the oddity degree for each energy storage cell group (module) is displayed in sorted order on the display part 33 of the client apparatus 3 used by the operator. In the example of the screen shown in FIG. 9, a radio control 331 is displayed next to the graph for the operator to select whether or not the energy storage cell includes an odd energy storage cell. When the operator selects a "send" button 332 on the screen displayed on the display part 33 by the operation part 34, the control part 30 of the client apparatus 3 accepts the selection by each radio control 331 (S314) and transmits the data of the accepted selection to the server apparatus 2.

In the first example, the operator needs to determine whether or not an odd energy storage cell is included, but since the server apparatus 2 has narrowed down the determination target, the operator may make a determination only on the energy storage cell group having a high possibility of including an odd energy storage cell. The energy storage system 101 of the present embodiment includes about 960 (=80 banks×12 (modules per bank)) modules, so that it is possible to significantly reduce the workload of the operator compared with a case where the operator confirms individual graphs, values (scores) of the oddity degree, and measurement data.

In a second example, the control part 20 analyzes the created pattern of the time distribution of the oddity degree to determine whether or not an odd energy storage cell is included. Referring to the time distribution of the oddity degree shown in FIG. 9, there are a pattern A of module #11 in which the oddity degree simply increases and exceeds the predetermined value, a pattern B of module #5 in which the oddity degree exceeds a predetermined value but decreases, and a pattern C of module #6 in which the oddity degree exceeds the predetermined value and then decreases but simply increases again. In the pattern B, the oddity degree has exceeded the predetermined value, but the energy storage device is gradually balanced and matched with the surrounding energy storage cells, and it is determined that an odd energy storage cell to be excluded is not included. It cannot be determined at this point as to whether the pattern C will become the pattern A or the pattern B after the lapse of time, it is determined that only the pattern A is the time distribution of the oddity degree of the energy storage cell group including an odd energy storage cell.

Figure 10:
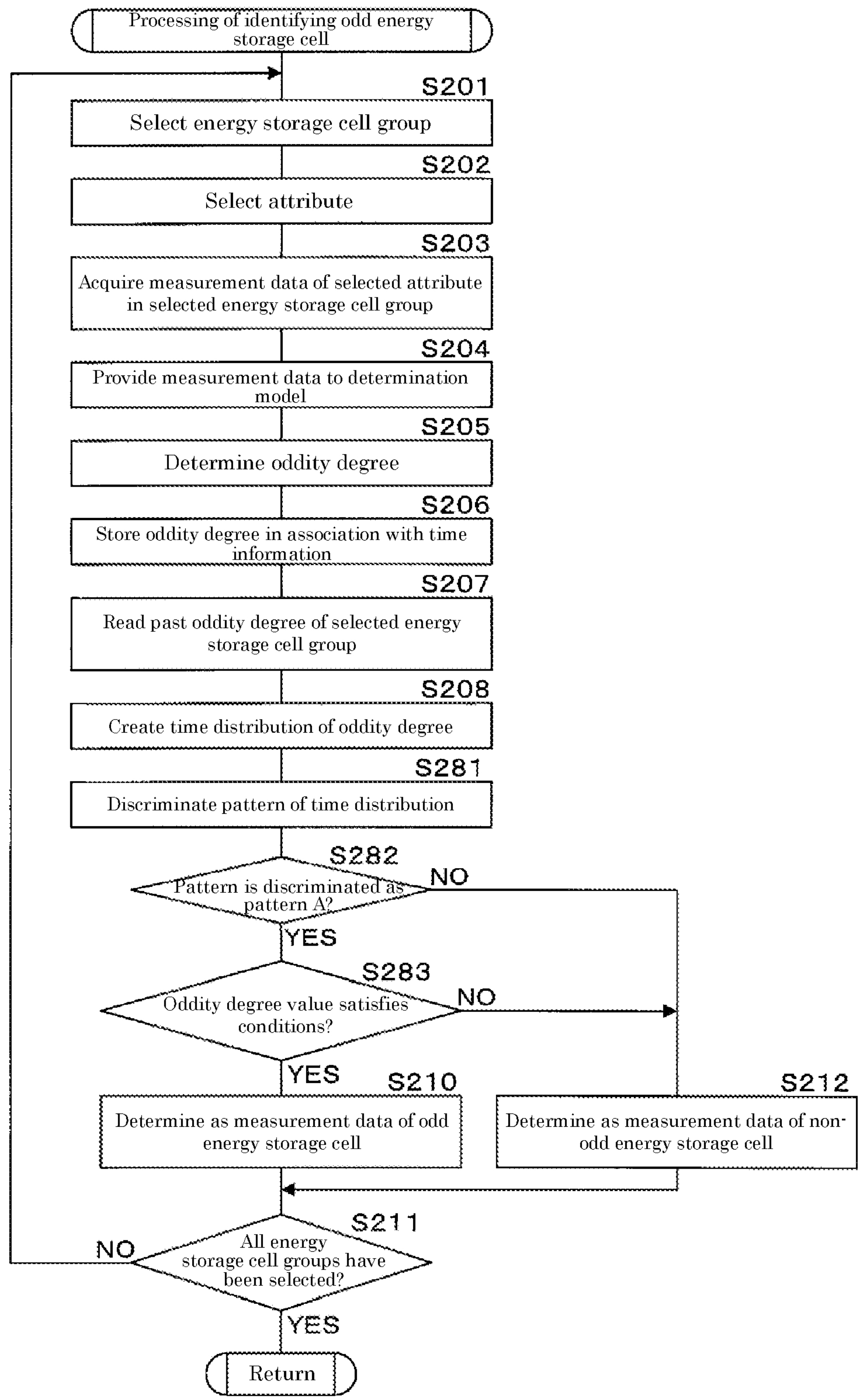
FIG. 10 is a flowchart showing a procedure for determining whether or not an energy storage cell is included in a second example.

FIG. 10 is a flowchart showing a procedure for determining whether or not an energy storage cell is included in the second example. The processing procedure shown in the flowchart of FIG. 10 is a detailed explanation of the processing of step S209 in the flowchart of FIG. 6. The same step numbers are assigned to procedures common to those in the flowchart of FIG. 6, and a detailed description thereof will be omitted.

The control part 20 of the server apparatus 2 discriminates which of the previously classified patterns A, B, and C is the rise and fall pattern of the oddity degree in the time distribution created in step S208 (step S281).

The control part 20 determines whether or not the pattern has been discriminated as the pattern A in step S281 (step S282), and when it is determined that the pattern is not discriminated as the pattern A (step S282: NO), the control part 20 advances the processing to step 212.

When it is determined in step S281 that the pattern has been discriminated as the pattern A (step S282: YES), the control part 20 determines whether or not the maximum value or average value of the oddity degree in the past read in step S207 is equal to or more than a first predetermined value and whether or not the differential value (change with time) of the oddity degree in the pattern A is equal to or more than a second predetermined value (step S283).

When it is determined in step S283 that the maximum value or the average value of the oddity degree is equal to or more than the first predetermined value and the differential value of the oddity degree in the pattern A is equal to or more than the second predetermined value (step S283: YES), the control part 20 advances the processing to step S210.

When it is determined in step S283 that the maximum value or the average value is less than the first predetermined value or the differential value of the oddity degree is less than the second predetermined value (NO in step S283), the control part 20 advances the processing to step S212.

In the case of the processing procedure shown in the flowchart of FIG. 10, the determination or selection operation by the operator is not required, and hence it is possible to automatically identify and exclude measurement data of an odd energy storage cell.

Figure 11:
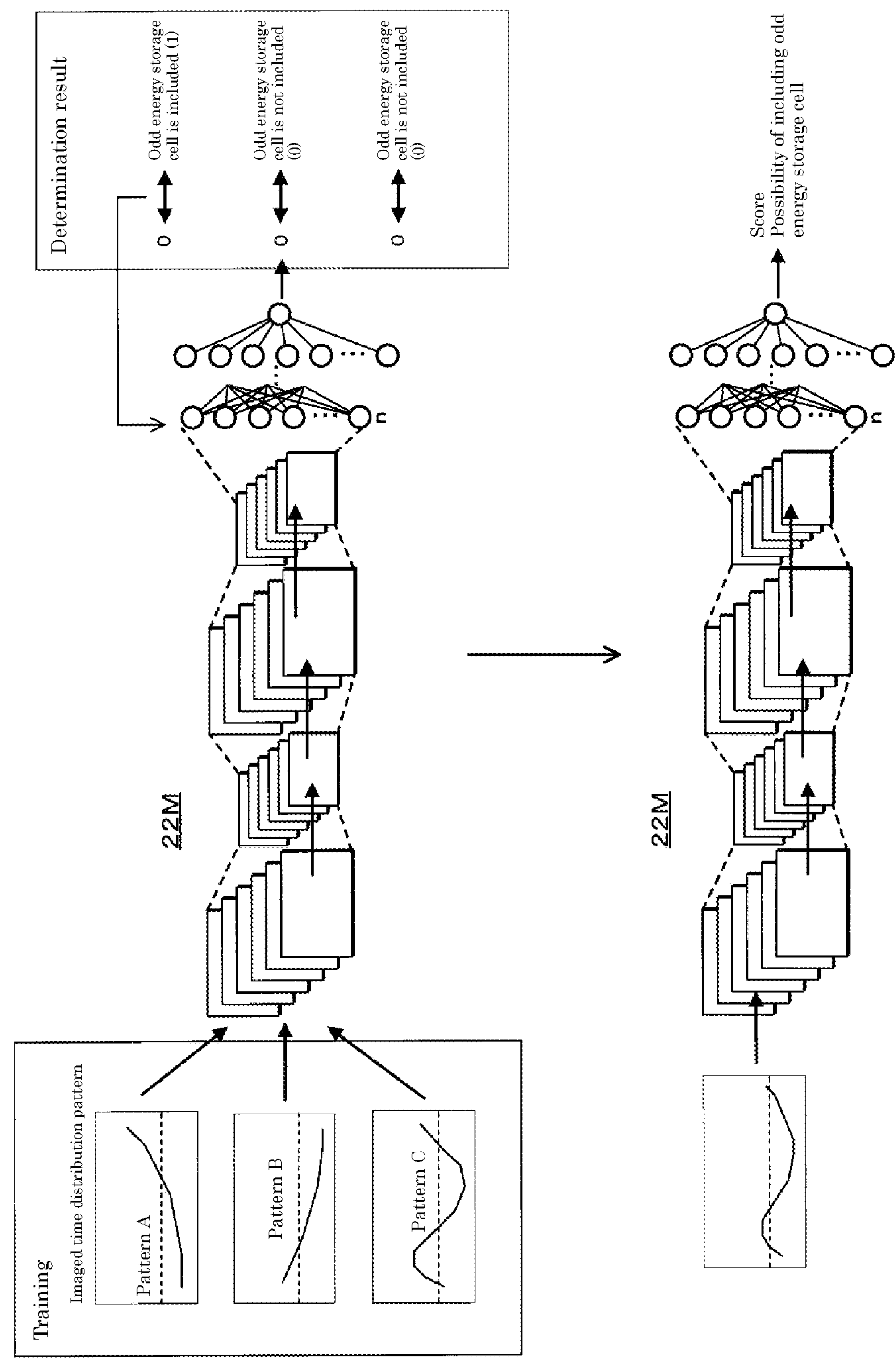
FIG. 11 is a schematic diagram of an image determination model based on an imaged time distribution.

In a third example, the control part 20 images the created time distribution of the oddity degree and determines whether or not an odd energy storage cell is included by using an image determination model, which is a classifier using a neural network for the image. FIG. 11 is a schematic diagram of an image determination model 22M based on an imaged time distribution. The image determination model 22M is a neural network including an intermediate layer including a convolution layer or a pooling layer for extracting a feature amount, and when an image of a time distribution is input, the possibility (score) that the measurement data relating to the time distribution includes measurement data of an odd energy storage cell is output. The image determination model 22M may be stored in the storage part 21 of the server apparatus 2 together with the determination model 2M. As shown in FIG. 11, the image determination model 22M is learned by teacher data that is a pair of the time distribution imaged and the result determined by the operator.

When the teacher data can be collected, the image determination model 22M may be learned as a model for discriminating the oddity of the odd energy storage cell. For example, the image determination model 22M may be a model for discriminating which of the previously classified patterns A, B, and C in FIG. 11 is to be used. The control part 20 may discriminate the oddity degree on the basis of the value of the oddity degree used for the determination in step S209, the time distribution created in step S208, and/or the measurement data of the selected energy storage cell group. The control part 20 may determine the oddity degree, that is, how much the energy storage cell deviates from the standard energy storage cell. In another example, the control part 20 may use the image determination model 22M to discriminate the oddity, such as whether the oddity is "a new energy storage cell", "an energy storage cell of better quality (longer life) than a standard energy storage cell", or "an energy storage cell of shorter life than a standard energy storage cell".

Figure 12:
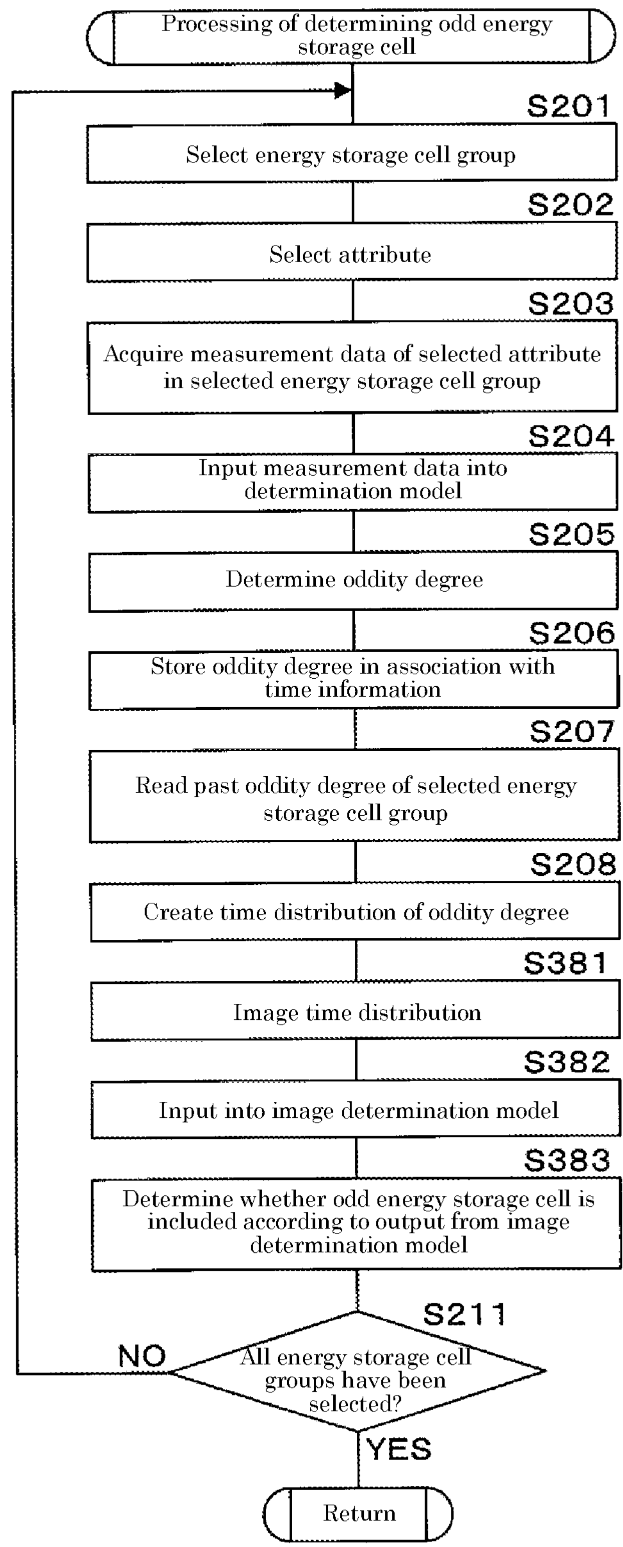
FIG. 12 is a flowchart showing a procedure for determining whether or not an energy storage cell is included in a third example.

FIG. 12 is a flowchart showing a procedure for determining whether or not an energy storage cell is included in the third example. The processing procedure shown in the flowchart of FIG. 12 is a detailed explanation of the processing of step S209 in the flowchart of FIG. 6. The same step numbers are assigned to procedures common to those in the flowchart of FIG. 6, and a detailed description thereof will be omitted.

The control part 20 of the server apparatus 2 images the time distribution created in step S208 (step S381) and inputs the imaged time distribution into the previously learned image determination model 22M (step S382). The control part 20 determines whether or not the target energy storage cell group includes an odd energy storage cell according to the score output from the image determination model 22M (step S383) and advances the processing to step S211.

At a time point when an image to be used as teacher data and a correct determination result are collected, the determination accuracy is expected to be improved by a shift from the pattern analysis of the second example to the image determination model 22M of the third example.

When a screen showing the state of the energy storage system 101 is requested from the client apparatus 3 used by the operator by an information presentation function in the remote monitoring system 100, the server apparatus 2 can create and transmit the information of the screen. In the second or third example described above, when automatically determining that an odd energy storage cell is included for each energy storage cell group, the control part 20 of the server apparatus 2 can transmit a screen, enabling visual recognition of which energy storage cell group includes an odd energy storage cell, to the client apparatus 3 and display the screen.

In order to create a screen for visual recognition of an energy storage cell group including an odd energy storage cell, when it is determined that the energy storage cell group includes an odd energy storage cell on the basis of the latest measurement data in the determination processing (FIG. 6, FIG. 10, or FIG. 12) for each energy storage cell group, the control part 20 of the server apparatus 2 stores that an odd energy storage cell is included in association with the identification information of the energy storage cell group. Even when it is determined similarly that an odd energy storage cell is included, as in the first example or the second example, when each pattern can be identified, the control part 20 stores the energy storage cell into the storage part 21 together with information for discriminating which pattern.

Figure 13:
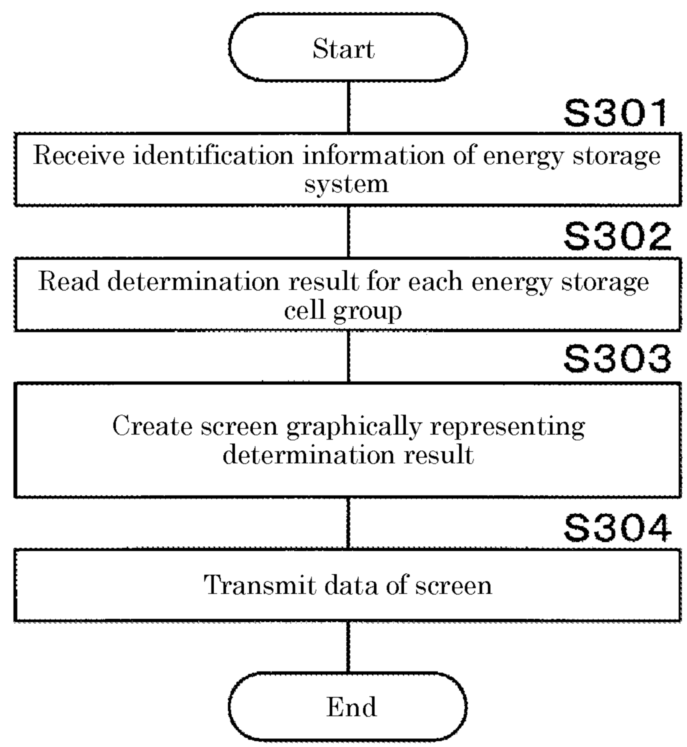
FIG. 13 is a flowchart showing an example of a processing procedure for information presentation in the server apparatus.

FIG. 13 is a flowchart showing an example of a processing procedure for information presentation in the server apparatus 2. The control part 20 of the server apparatus 2 receives the identification information of the target energy storage system 101 from the client apparatus 3 (step S301) and reads a determination result as to whether or not an odd energy storage cell, stored for each energy storage cell group included in the energy storage system 101 corresponding to the received identification information, is included (step S302).

Figure 14:
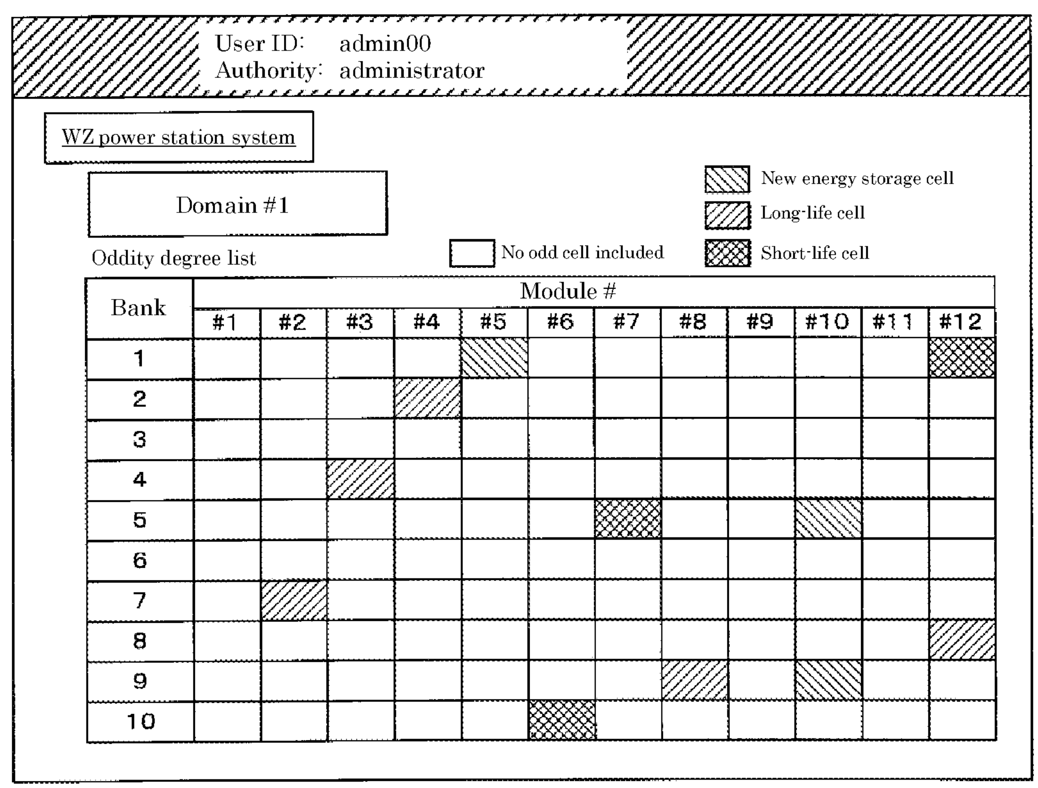
FIG. 14 is a diagram showing an example of a screen including a determination result as to whether or not an odd energy storage cell is included.

The control part 20 creates a screen graphically representing the read determination result (step S303), transmits the data of the created screen to the client apparatus 3 (step S304), and ends the processing. In step S303, for example, as shown in FIG. 14, the determination result is created as a table for each energy storage cell group. Other graphs may be used. The processing of each of steps S302 and S303 may be sequentially performed regardless of the request from the client apparatus 3, and the latest screen data may be stored into the storage part 21, and may be transmitted when the request is satisfied (S304).

FIG. 14 shows an example of a screen including a determination result as to whether or not an odd energy storage cell is included. As shown in FIG. 14, for each domain included in the energy storage system 101, cells corresponding to an energy storage cell group (module) including odd energy storage cells are highlighted by hatching in a table having identification information (identification numbers) of banks and modules in rows or columns. In this way, it is possible to make visually recognizable where the energy storage cell group including an odd energy storage cell is located and to enable the operator to grasp the state of the energy storage cell at a stage before an abnormality occurs or at a time when observation is required when a new energy storage cell is added. In FIG. 14, the type of hatching is changed and displayed in accordance with the oddity or the degree of the oddity. When the oddity can be discriminated by the second or third example described above, as shown in FIG. 14, the oddity can be discriminated and displayed.

In the embodiment described above, the description has been given of the processing of determining measurement data of an odd energy storage cell by the server apparatus 2 that collects measurement data of the energy storage device group. The processing of determining measurement data of an odd energy storage cell may be performed by the management apparatus M of the energy storage system 101 having a hierarchical structure of domains, banks, and modules.

In the embodiment described above, the description has been given of the processing of state diagnosis, deterioration estimation, or life prediction in the energy storage system 101 including energy storage devices each having a hierarchical structure of domains and banks. The same processing can also be applied to a case where the energy storage module group L in which a plurality of energy storage devices included in an uninterruptible power system U and a rectifier D are connected in parallel.

The embodiments disclosed above are illustrative in all respects and are not restrictive. The scope of the present invention is defined by the claims and is intended to include meanings equivalent to the claims and all modifications within the claims.

The invention claimed is:

1. A data processor that processes measurement data for an energy storage device, the processor comprising:

a storage part that stores a determination model learned to output a score, which corresponds to whether measurement data of an odd energy storage device is included in measurement data measured for each energy storage device or for each energy storage device group grouped from a plurality of the energy storage devices, when acquired measurement data is input, the odd energy storage device having a life with a duration less than a life of a standard energy storage device, the determination model being learned using measurement data of the standard energy storage device and the measurement data of the odd energy storage device;

a determination part that determines presence of the measurement data of the odd energy storage device on a basis of the score output by inputting the acquired measurement data into the determination model; and a processing part that:

at least one of generates or updates a tabular display that flags one or more cells associated with the odd energy storage device in a visually recognizable manner; and when a predetermined ratio of the measurement data of the odd energy storage device relative to the measurement data for the energy storage device or the energy storage device group exceeds a predetermined ratio, causes the determination model to re-learn using all the acquired measurement data.

2. The data processor according to claim 1, wherein the processing part excludes the measurement data of the odd energy storage device, determined by the determination part, from the measurement data for the energy storage device and executes processing of estimating a deterioration state or predicting a life of the energy storage device by using remaining measurement data exclusive of the measurement data of the odd energy storage device.

3. The data processor according to claim 1, wherein the determination model is learned for each attribute of the acquired measurement data.

4. The data processor according to claim 1, wherein the determination part:

stores the score, that is output each time measurement data of a target energy storage device or target energy storage device group at a different time point is input into the determination model, in association with time information, creates a time distribution of the stored score at the different time point, and determines whether the measurement data of an odd energy storage device is included in the measurement data of the target energy storage device or target energy storage device group on a basis of the time distribution.

5. The data processor according to claim 4, wherein the determination part determines the measurement data of an odd energy storage device on a basis of a rise and fall pattern of the stored score in the time distribution or a time differential value of the stored score.

6. The data processor according to claim 4, wherein:

when an image obtained by imaging a time distribution is input, a second determination model, learned to determine whether the measurement data of an odd energy storage device is included in the measurement data of an energy storage device or an energy storage device group corresponding to the time distribution, is stored in the storage part, and the determination part images the created time distribution and inputs the imaged time distribution into the second determination model, and when the second determination model determines that the measurement data of the odd energy storage device is included, the determination part determines the measurement data relating to the time distribution as the measurement data of the odd energy storage device.

7. The data processor according to claim 4, wherein the determination part:

stores the time distribution created for the target energy storage device or energy storage device group in association with information for identifying the target energy storage device or energy storage device group, sorts the target energy storage device or energy storage device group with a value of the stored score included in the time distribution, accepts, in sorted order, selection of the measurement data of the energy storage device or energy storage device group including the measurement data of an odd energy storage device on a basis of the time distribution, and determines the selected measurement data as the measurement data of the odd energy storage device.

8. The data processor according to claim 1, wherein the determination model is re-learned using remaining measurement data obtained by excluding the measurement data of the odd energy storage device determined by the determination part from the measurement data of the energy storage device.

9. The data processor according to claim 1, wherein the determination model is learned by teacher data for each use environment of the energy storage device.

10. A data processing method for processing measurement data for an energy storage device, the method comprising:

using a determination model learned to output a score, which corresponds to whether measurement data of an odd energy storage device is included in measurement data measured for each energy storage device or for each energy storage device group grouped from a plurality of the energy storage devices, the odd energy storage device having a life with a duration less than a life of a standard energy storage device, the determination model being learned using measurement data of the standard energy storage device and the measurement data of the odd energy storage device;

when acquired measurement data is input, determining presence of the measurement data of the odd energy storage device on a basis of the score output by inputting the acquired measurement data into the determination model, at least one of generating or updating a tabular display that flags one or more cells associated with the odd energy storage device in a visually recognizable manner, and when a predetermined ratio of the measurement data of the odd energy storage device relative to the measurement data for the energy storage device or the energy storage device group exceeds a predetermined ratio, causes the determination model to re-learn using all measurement data.

11. At least one non-transitory computer-readable storage medium having computer-readable program code portions stored therein and configured for:

using a determination model learned to output a score, which corresponds to whether measurement data of an odd energy storage device is included in measurement data measured for each energy storage device or for each energy storage device group grouped from a plurality of the energy storage devices, when acquired measurement data is input, the odd energy storage device having a life with a duration less than a life of a standard energy storage device, the determination model being learned using measurement data of the standard energy storage device and the measurement data of the odd energy storage device, determining presence of the measurement data of the odd energy storage device on a basis of the score output by inputting the acquired measurement data into the determination model, at least one of generating or updating a tabular display that flags one or more cells associated with the odd energy storage device in a visually recognizable manner, and when a predetermined ratio of the measurement data of the odd energy storage device relative to the measurement data for the energy storage device or the energy storage device group exceeds a predetermined ratio, causes the determination model to re-learn using all measurement data.

* * * * *